(12) United States Patent
Dhanasekaran

(10) Patent No.: US 8,947,125 B2
(45) Date of Patent: Feb. 3, 2015

(54) FAST, LOW POWER COMPARATOR WITH DYNAMIC BIAS BACKGROUND

(71) Applicant: QUALCOMM Incorporated, San Diego, CA (US)

(72) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/773,427

(22) Filed: Feb. 21, 2013

(65) Prior Publication Data

US 2014/0232457 A1    Aug. 21, 2014

(51) Int. Cl.
| | | |
|---|---|---|
| H03K 5/22 | (2006.01) | |
| H03F 3/45 | (2006.01) | |
| H02M 3/156 | (2006.01) | |
| H02M 1/00 | (2006.01) | |

(52) U.S. Cl.
CPC ............. *H03F 3/45* (2013.01); *H02M 3/156* (2013.01); *H02M 2001/0032* (2013.01)
USPC .............. 327/63; 330/296; 330/295; 323/280

(58) Field of Classification Search
USPC ....................... 327/63; 330/296, 295; 323/280
See application file for complete search history.

(56) References Cited

U.S. PATENT DOCUMENTS

| | | | |
|---|---|---|---|
| 5,032,744 A | 7/1991 | Wai Yeung Liu | |
| 6,239,654 B1* | 5/2001 | Yamamoto | 330/9 |
| 7,443,214 B2* | 10/2008 | Kimura | 327/156 |
| 2009/0267573 A1 | 10/2009 | Chien et al. | |
| 2010/0308784 A1* | 12/2010 | Scoones et al. | 323/282 |
| 2011/0084767 A1* | 4/2011 | Kocer et al. | 330/296 |
| 2011/0090014 A1* | 4/2011 | Kocer et al. | 330/296 |
| 2011/0156684 A1* | 6/2011 | da Silva et al. | 323/284 |
| 2012/0049815 A1 | 3/2012 | Veeramreddi et al. | |
| 2012/0091981 A1 | 4/2012 | Komiya | |
| 2013/0051089 A1* | 2/2013 | Pan et al. | 363/21.17 |
| 2013/0099863 A1* | 4/2013 | Parkhurst et al. | 330/253 |
| 2013/0147448 A1* | 6/2013 | Kadanka | 323/280 |
| 2013/0187620 A1* | 7/2013 | Parkhurst | 323/234 |
| 2013/0237166 A1* | 9/2013 | Rofougaran et al. | 455/127.1 |

OTHER PUBLICATIONS

Shao B., "A novel low quiescent current PFM method with independent threshold for buck switching converters," Analog Integrated Circuits and Signal Processing, Springer, Aug. 11, 2012, pp. 1-12.
International Search Report and Written Opinion—PCT/US2014/016308—ISA/EPO—Aug. 12, 2014.

* cited by examiner

*Primary Examiner* — Ryan Jager
(74) *Attorney, Agent, or Firm* — Arent Fox LLP

(57) ABSTRACT

A comparator circuit comprising an operational amplifier configured to compare a difference between a switching voltage and a reference voltage, and a dynamically adjustable bias current generator coupled to the operational amplifier. A method of conserving power in a comparator circuit includes estimating a switching regulator load current value, communicating the value to a current bias generator, enabling the bias generator with a signal from a switching regulator PFM logic circuit, and establishing a bias current at an operational amplifier of the comparator circuit on the basis of the enabling.

20 Claims, 7 Drawing Sheets

FAST, LOW POWER COMPARATOR WITH DYNAMIC BIAS BACKGROUND

BACKGROUND

1. Field

The present disclosure relates generally to comparators. More specifically the present disclosure related to a comparator for MP3 playback having dynamic peak bias current that automatically adjusts quickly according to the load current variations.

2. Background

In certain functional operations, such as MP3 playback, low standby current and playback current/power (e.g., 0.1 mW) are required. A buck/flyback converter requires a fast, low power comparator for inductor current control. Due to space and cost constraints in mobile applications, small size inductors are desirable. Small inductors have low saturation current, which forces the design to work with non-linear inductors, in which magnetic materials exhibit nonlinear permeability over a range, which makes the resulting inductance a function of the applied current. However, because the inductor value drops, the current increases very quickly while in magnetic saturation. To keep device reliability and limit input current, a fast peak current comparator is desired. Thus, the speed requirement of the comparator conflicts with the low power requirement.

MP3 playback may be incorporated in wireless communication devices. Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms. As an example, smart phones typically incorporate digital music files for playback, expanding the consumer entertainment value of the device. Smart phones are typically used as much for their entertainment value (e.g., games, music and video streaming and playback) as they are for communications.

Several examples of fast current comparators exist. For example, (referring to FIG. 1), class-H power amplifier solutions may use a buck/negative charge pump (NCP) to generate positive and negative supply envelope for the output signal of a power amplifier (PA). Due to prior knowledge of signal in the digital signal chain, the reference voltage for the buck regulator can be generated in advance. Referring to FIG. 2, the load current of the buck regulator is predictable because of the known value of the PA output signal and standard load resistance.

Buck efficiency is optimized by tightly controlling inductor current. However, buck inductors may add significant cost. A class-G switched capacitor (SC) power converter may be used, however, it can only generate discrete output levels and also because such switches may require significant die area. To save cost, ferrite beads may be used to replace inductors. However, ferrite beads have poor inductance vs. current (L vs. I) characteristics.

Therefore, there is a need in the art for a high speed comparator to control inductor current.

SUMMARY

In an embodiment, a comparator circuit includes an operational amplifier comparing a difference between a switching voltage and a reference voltage, and a dynamically adjustable bias current generator coupled to the operational amplifier.

In an embodiment, a method of conserving power in a comparator circuit, includes estimating a switching regulator load current value, communicating the value to a current bias generator, enabling the bias generator with a signal from a switching regulator PFM logic circuit, and establishing a bias current to an operational amplifier of a comparator on the basis of the enabling.

DETAILED DESCRIPTION

Figure 1:
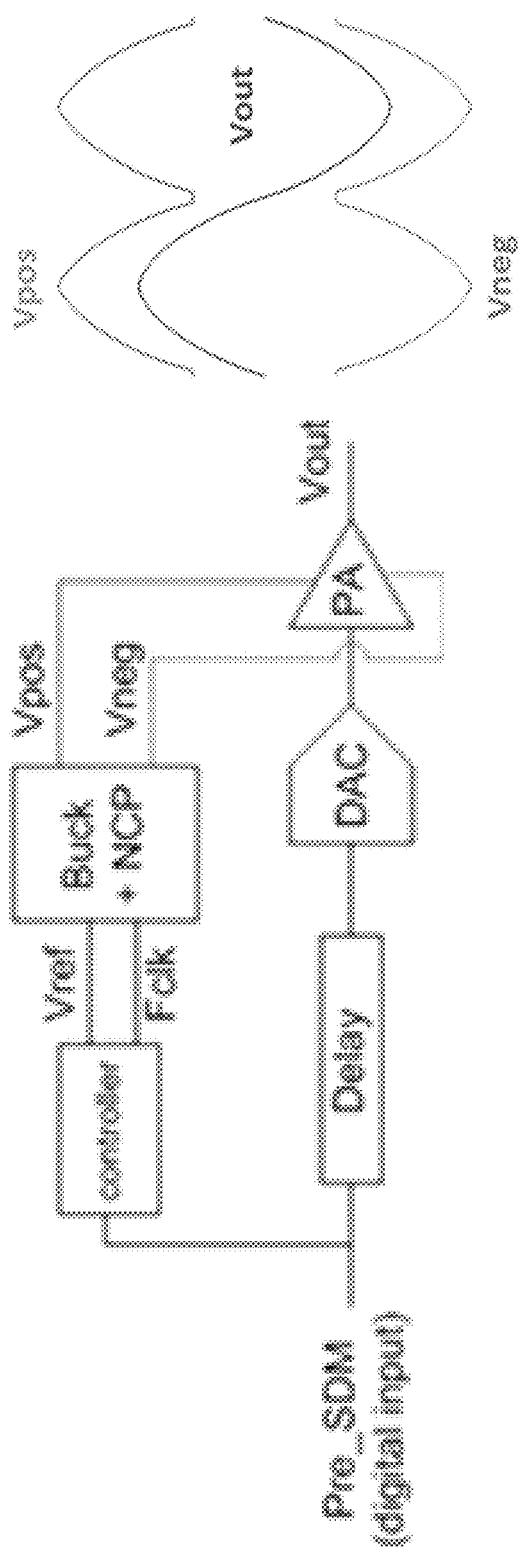
FIG. 1 illustrates disclosure class-H power amplifier.
Figure 2:
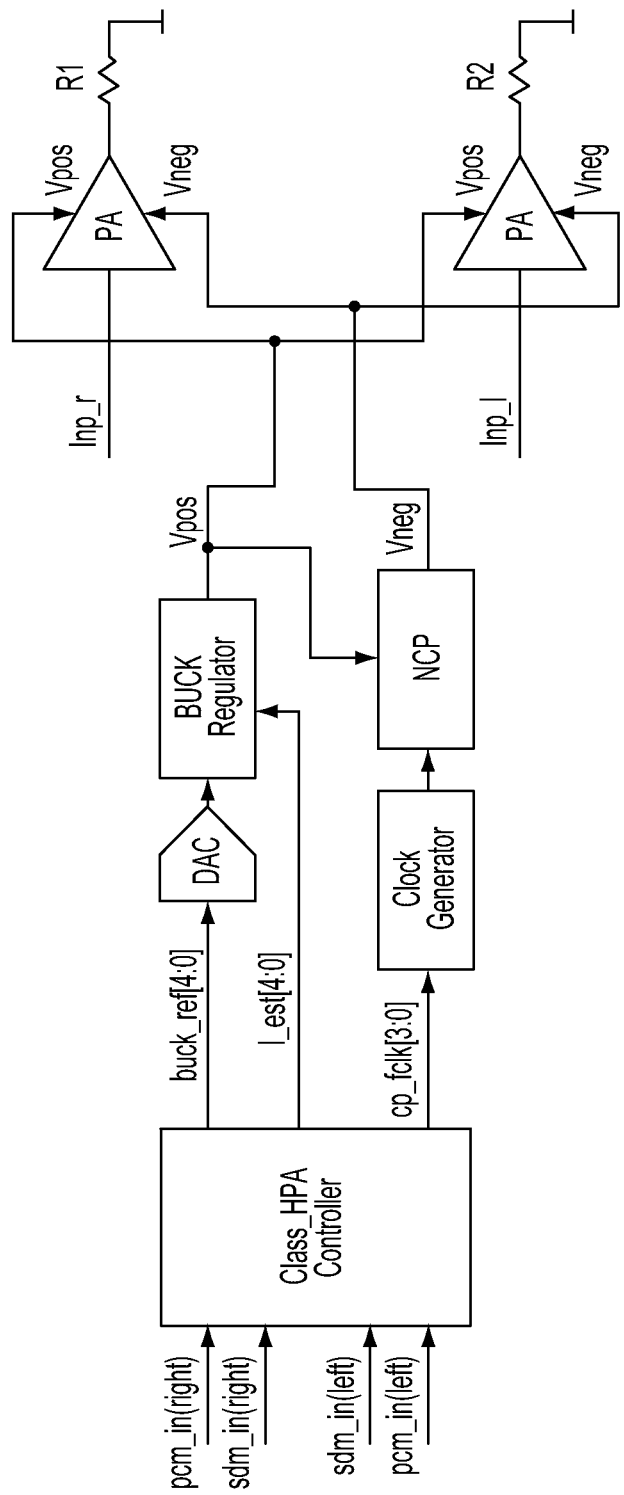
FIG. 2 illustrates a block diagram of disclosure buck regulator.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

MP3 playback may be incorporated in wireless communication devices. Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Furthermore, various aspects are described herein in connection with a terminal, which can be a wired terminal or a wireless terminal A terminal can also be called a system, device, subscriber unit, subscriber station, mobile station, mobile, mobile device, remote station, remote terminal, access terminal, user terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Figure 3:
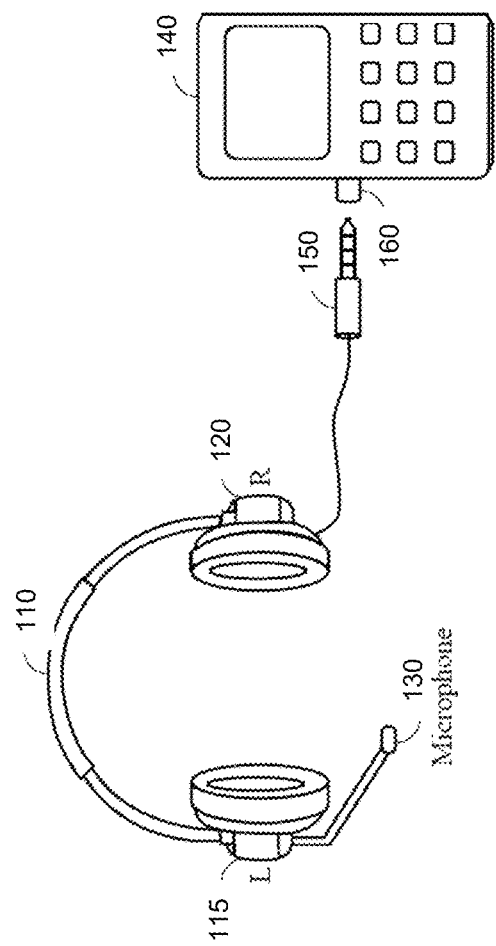
FIG. 3 illustrates a wireless device enabled to provide audio output to a stereo headphone in accordance with certain embodiments of the disclosure.

FIG. 3 illustrates a wireless device 140 enabled to provide audio output to a stereo headphone 110. The wireless device 140 may include an MP3 player to provide the audio output. A plug 150 inserted into a jack 160 receives an electrical signal corresponding to left and right stereo audio output of the wireless device 140. Left and right channels of stereo audio are transduced at left earphone 115 and right earphone 120 to acoustic signals. A microphone 130 may be included to sense audio for transmission to the wireless device through the plug 150.

The wireless device 140 may be, for example, a smart phone capable of receiving signals via standard wireless telecommunications channel, and may also be equipped to receive signals via wireless Internet channels, such as WiFi, or other wireless access point. In a further embodiment, the device 140 may not be a wireless device, but may be an MP3 player storing audio content provided by wired connection to a computer.

In certain functional operations, such as MP3 playback, low standby current and playback current/power (e.g., 0.1 mW) are required. A buck/flyback converter requires a fast, low power comparator for inductor current control. Due to space and cost constraints in mobile applications, small size inductors are desirable. Small inductors have low saturation current, which forces the design to work with non-linear inductors. However, because the inductor value drops, the current increases very quickly while in magnetic saturation. To keep device reliability and limit input current, a fast peak current comparator is desired. Thus, the speed requirement of the comparator conflicts with the low power requirement. A fast peak current comparator may enable usage of a small footprint inductor with a low saturation current value.

Figure 4:
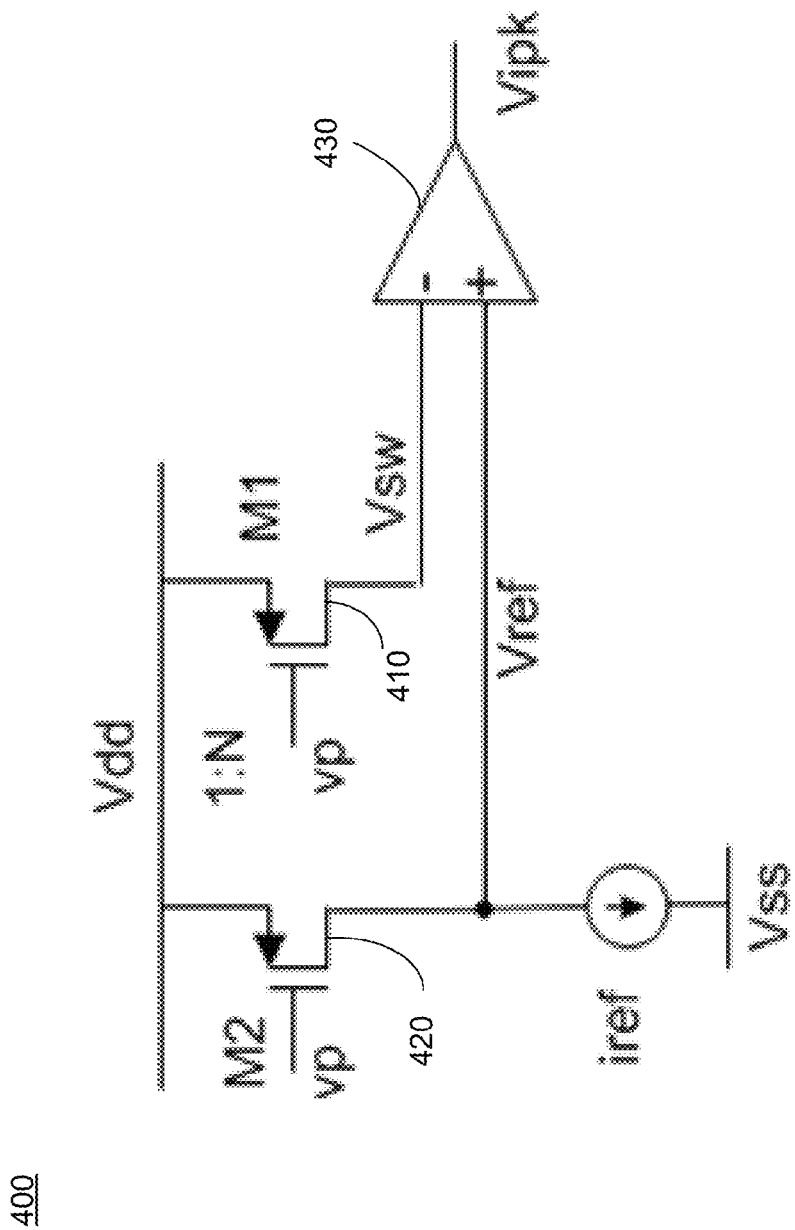
FIG. 4 illustrates a comparator circuit in accordance with certain embodiments of the disclosure.

FIG. 4 illustrates an embodiment of an $i_{peak}$ comparator circuit 400. The comparator 400 is designed to trigger when the current through the PMOS power switching transistor M1 410 reaches a peak value ($i_{pk}$). The scaled replica switch M2 420 is used to derive the reference voltage for the comparator 400. Since the M2 switch 420 is N times smaller, the reference current needed to produce a voltage equal to the drain voltage of M1 as it passes through $i_{pk}$, is also N times smaller. Thus, a current source forces a current with value $i_{ref}=i_{pk}/N$ on M2 to produce the reference voltage $V_{ref}$ at the drain of the device M2. The $i_{pk}$ comparator compares the switcher output voltage $V_{sw}$ from the PMOS power switch transistor M1 410 to the reference voltage ($V_{ref}$) corresponding to the desired peak current ($I_{pk}$) at an operational amplifier 430. When the transistor M1 is on, the current through M1 increases causing $V_{sw}$ node voltage to drop. When $V_{sw}$ voltage drops below $V_{ref}$, the comparator triggers, and is used to turn off the PMOS power switch M1 410. A similar scheme is used for a valley current comparator with M1 410 and M2 420 replaced with NMOS devices connected to $V_{ss}$.

Figure 5:
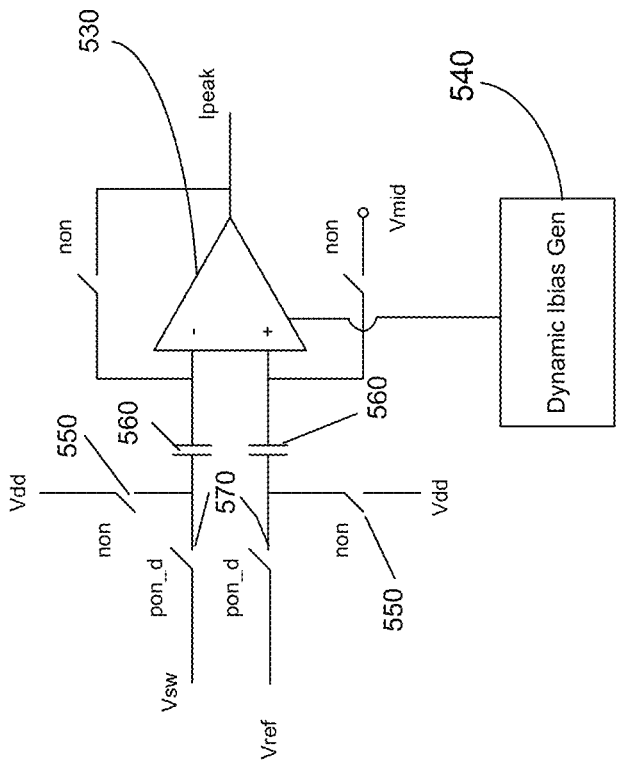
FIG. 5 illustrates a comparator circuit with a bias current that is dynamically adjustable in accordance with certain embodiments of the disclosure.

FIG. 5 illustrates a comparator 500 with a bias current that is dynamically adjustable according to the load current. A dynamic bias generator 540 adjusts the bias current of the comparator operational amplifier 530 according to the load current. This dynamic bias achieves the necessary speed at high currents. Frequency compensation is applied only in the reset phase. This enables increased speed in the evaluate phase, and offset cancellation in reset phase without sacrificing speed. This provides a better speed/power trade off across a range of load currents compared to conventional comparators. Simultaneously, the current is scaled down at light loads to boost the efficiency. Conventional approaches either provide fast switching to support low inductance or efficiency of low power at light loads.

The comparator 500 bias current is automatically adjusted according to the load current. This allows it to achieve the necessary speed at high currents. At the same time, the current is scaled down at light loads to boost the efficiency.

In operation, a reset phase begins when an NMOS power switch is turned on (non=1). The reset phase ends at the beginning of the NMOS power switch turn off phase. The NMOS power switch control is also tied to the comparator switch 550. In reset phase, the sampling capacitors' bottom plates are connected to $V_{dd}$ and the operational amplifier 530 is in unity feedback with $V_{mid}$ as input voltage. Sampling capacitors 560 are charged to $V_{mid}+V_{offset}$—this provides common mode shift and offset cancellation. The evaluation phase starts when a PMOS power switch 570 is turned on (pon_d=1). A delayed version of the PMOS power switch control signal is also tied to the switch 570. The switcher node $V_{sw}$ is compared with $V_{ref}$ (while cancelling offset). Bias boost and reset are provided for a short period (e.g., ~80 ns) every time the pulse frequency modulation (PFM) loop enters active mode.

Figure 6:
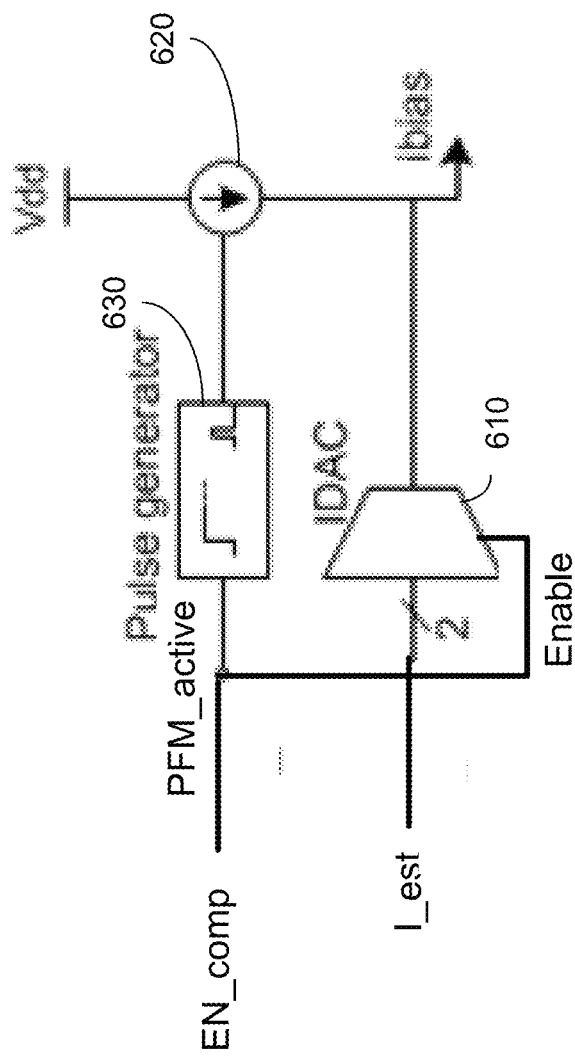
FIG. 6 illustrates features of a dynamic current bias generator for the comparator of FIG. 5.

FIG. 6 illustrates features of the dynamic current bias generator 540, according to an embodiment. An estimated load current input parameter $i_{est}$ is used to set the bias current of the comparator—this estimate may be available, for example, from a digital controller and converted to an analog current by a current digital-to-analog converter 610, but it is also possible to get this from feedback. A compensation enable signal EN_comp simultaneously enables both the Pulse Generator 630, activating a Pulse Frequency Modulation (PFM) mode, and a current digital-to-analog converter IDAC 610.

In an aspect of the comparator, at a load current >100 mA, $i_{bias}$ may be set to 100% by the IDAC 610; at a load current <100 mA, $i_{bias}$ may be set, for example, to 50%. When in Pulse-Frequency Modulation (PFM) mode, the $i_{bias}$ may be set to 0%. This feature lets the comparator power scale with load current. At 100% bias, the comparator delay time may be a relatively low ~10 ns. Conversely, under no load condition, the core comparator power is 0.

In another aspect of the comparator, while exiting the inactive PFM phase, the comparator current may be boosted for a short duration (e.g., 400%) by a current source 620 controlled by a pulse generator 630. This allows for a fast wakeup to react to sudden transient load currents.

Figure 7:
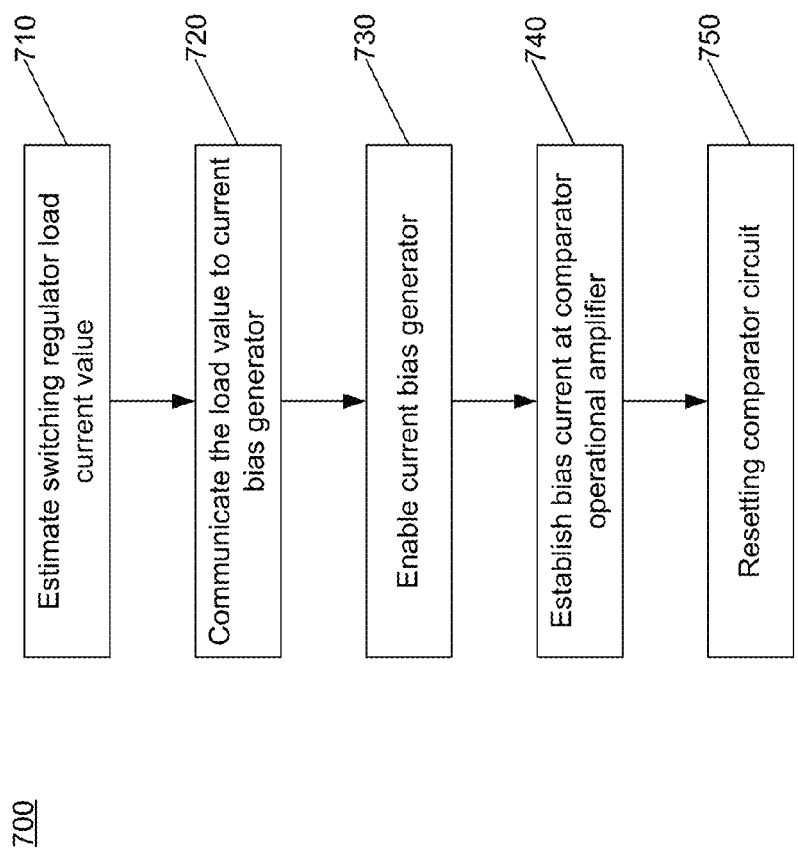
FIG. 7 illustrates a method of conserving power in a comparator circuit in accordance with certain embodiments of the disclosure.

FIG. 7 illustrates a method 700 of conserving power in a comparator circuit 500. In method block 710, an estimate is made of a load current value to be supplied by a switching regulator. In method block 720, the load current estimate is communicated to the current bias generator 540. The current bias generator 540 is enabled by a signal from a switching regulator pulse-frequency modulation (PFM) logic circuit (in method block 730). In method block 740, a bias current at an operational amplifier is established on the basis of the estimated load current value and the enabling signal. The bias current is established by receiving a digital signal of estimated load at a digital-to-analog converter current source, which sets a bias current of the operational amplifier on the basis of the digital signal. In method block 750, the comparator 500 is reset by an internal switch (not shown) for the next estimation and is frequency compensated by switching in a compensation capacitor (not shown) during the resetting.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A comparator circuit comprising:
    an operational amplifier configured to compare a difference between a switching voltage ($V_{sw}$) and a reference voltage ($V_{ref}$); and
    a dynamically-adjustable bias current generator coupled to the operational amplifier, comprising:
        a pulse generator configured to receive a pulse frequency modulation enabling signal, and
        a digital-to-analog converter current source configured to receive a digital-estimated load current signal and output a bias current to the operational amplifier.

2. The comparator circuit of claim 1, wherein the bias current generator controls the bias current of the operational amplifier in response to a switching regulator load current.

3. The comparator circuit of claim 1, further comprising a first power switching transistor having a drain coupled to a first input of the operational amplifier.

4. The comparator circuit of claim 3, wherein the power switching transistor provides the switching voltage from its drain to the first input.

5. The comparator circuit of claim 1, further comprising a scaled replica switch transistor coupled to a second input of the operational amplifier.

6. The comparator circuit of claim 5, wherein the scaled replica switch transistor provides the reference voltage to the second input.

7. The comparator circuit of claim 6, further comprising a current source coupled to the scaled replica switch transistor and the second input to determine the value of $V_{ref}$.

8. A method of conserving power in a comparator circuit, comprising:
    estimating a switching regulator load current value;
    communicating the load current value to a current bias generator;
    enabling the bias current generator with an enabling signal from a switching regulator PFM logic circuit; and
    establishing a bias current at an operational amplifier of the comparator circuit on the basis of the enabling signal and the estimated load current value, comprising:
        receiving a digital signal of estimated load at a digital-to-analog converter current source, and
        setting a bias current of the operational amplifier on the basis of the digital signal of estimated load.

9. The method of claim 8, further comprising:
    resetting the comparator circuit; and
    frequency compensating the comparator circuit by switching in a compensation capacitor while resetting.

10. The method of claim 8, further comprising:
    outputting a peak current from the operational amplifier on the basis of:
        a switching voltage ($V_{sw}$),
        a reference voltage ($V_{ref}$), and
        the estimated switching regulator load current value.

11. A non-transitory computer readable media including program instructions which when executed by a processor cause the processor to perform the method of conserving power in a comparator circuit, comprising:
    estimating a switching regulator load current value;
    communicating the load current value to a current bias generator;
    enabling the bias current generator with an enabling signal from a switching regulator PFM logic circuit; and
    establishing a bias current at an operational amplifier of the comparator circuit on the basis of the enabling signal and the estimated current value, comprising:
        receiving a digital signal of estimated load at a digital-to-analog converter current source, and
        setting a bias current of the operational amplifier on the basis of the digital signal of estimated load.

12. The non-transitory computer readable media of claim 11, further comprising:
    resetting the comparator circuit; and
frequency compensating the comparator circuit by switching in a compensation capacitor while resetting.

13. The non-transitory computer readable media of claim 11, further comprising:
    outputting a peak current from the operational amplifier on the basis of:
        a switching voltage ($V_{sw}$),
        a reference voltage ($V_{ref}$), and
        the estimated switching regulator load current value.

14. A comparator circuit comprising:
    means for comparing a difference between a switching voltage ($V_{sw}$) and a reference voltage ($V_{ref}$); and
    means for dynamically adjusting a bias current to the comparing means, comprising:
        means to receive a pulse frequency modulation enabling signal, and
        means for converting a digital estimated current signal to output the analog bias current to the comparing means.

15. The comparator circuit of claim 14, wherein the means for dynamically adjusting the bias current responds to the switching regulator load current.

16. The comparator circuit of claim 14, further comprising a first power switching means coupled to a first input of the comparing means.

17. The comparator circuit of claim 16, wherein the first power switching means provides the switching voltage from its drain to the first input.

18. The comparator circuit of claim 14, further comprising a second power switching means coupled to a second input of the comparing means.

19. The comparator circuit of claim 18, wherein the second power switching means provides the reference voltage to the second input.

20. The comparator circuit of claim 19, further comprising a current source coupled to the second power switching means and the second input to determine the value of $V_{ref}$.

* * * * *